United States Patent
Forbes et al.

(10) Patent No.: US 6,861,727 B2
(45) Date of Patent: Mar. 1, 2005

(54) ANTIFUSE STRUCTURES, METHODS, AND APPLICATIONS

(75) Inventors: Leonard Forbes, Corvallis, OR (US); Jerome M. Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 95 days.

(21) Appl. No.: 09/945,491

(22) Filed: Aug. 30, 2001

(65) Prior Publication Data

US 2002/0008300 A1 Jan. 24, 2002

Related U.S. Application Data

(63) Continuation of application No. 09/258,363, filed on Feb. 26, 1999, now Pat. No. 6,288,437.

(51) Int. Cl.[7] ............................................... H01L 29/00
(52) U.S. Cl. .......................... 257/530; 257/50; 257/529; 438/131; 438/467; 438/600
(58) Field of Search ........................... 257/50, 529–530; 438/131, 467, 600, 957

(56) References Cited

U.S. PATENT DOCUMENTS

| | | | | |
|---|---|---|---|---|
| 3,582,915 A | | 6/1971 | Chow ........................ 340/174 |
| 4,051,354 A | | 9/1977 | Choate ....................... 235/312 |
| 4,528,583 A | * | 7/1985 | te Velde et al. ............. 257/529 |
| 4,635,091 A | | 1/1987 | Roger ......................... 357/67 |
| 4,968,643 A | * | 11/1990 | Mukai ........................ 438/600 |
| 5,256,899 A | | 10/1993 | Rangappan .................. 257/665 |
| 5,303,199 A | | 4/1994 | Ishihara et al. .......... 365/225.7 |
| 5,327,380 A | | 7/1994 | Kersh, III et al. .......... 365/195 |
| 5,604,693 A | | 2/1997 | Merritt et al. ................ 365/96 |
| 5,652,169 A | * | 7/1997 | Jun ............................ 438/600 |
| 5,912,571 A | * | 6/1999 | Li et al. ..................... 327/143 |
| 5,930,596 A | | 7/1999 | Klose et al. ................... 438/98 |
| 5,936,297 A | | 8/1999 | Jun ............................. 257/530 |
| 6,080,649 A | * | 6/2000 | Werner et al. .............. 438/601 |
| 6,107,165 A | * | 8/2000 | Jain et al. ................... 438/467 |
| 6,115,312 A | * | 9/2000 | Jefferson et al. ............ 365/228 |
| 6,288,437 B1 | * | 9/2001 | Forbes et al. ............... 257/530 |

OTHER PUBLICATIONS

Baek, J.T., et al., "A new low–resistance antifuse with planar metal/dielectric/poly–Si/dielectric/metal structure", *Abstract, Japanese Journal of Applied Physics, Part 1, 36 (3B) (Regular Papers, Short Notes & Review Papers)*, Abstract No. B9707–2530F–004, (Mar. 1997).

(List continued on next page.)

*Primary Examiner*—Donghee Kang
(74) *Attorney, Agent, or Firm*—Schwegman, Lundberg, Woessner & Kluth, P.A.

(57) ABSTRACT

A typical integrated circuit includes millions of microscopic transistors, resistors, and other components interconnected to define a circuit, for example a memory circuit. Occasionally, one or more of the components are defective and fabricators selectively replace them by activating spare, or redundant, components included within the circuit. One way of activating a redundant component is to rupture an antifuse that effectively connects the redundant component into the circuit. Unfortunately, conventional antifuses have high and/or unstable electrical resistances which compromise circuit performance and discourage their use. Accordingly, the inventors devised an exemplary antifuse structure that includes three normally disconnected conductive elements and a programming mechanism for selectively moving one of the elements to electrically connect the other two. The programming mechanism includes a chemical composition that when heated releases a gas into a chamber to move one element, like a piston, from the bottom of the chamber to contact two elements overhanging the top of the chamber. This embodiment ultimately promises better performance because the element that completes the electrical connection has a relatively low and relatively stable resistance.

55 Claims, 5 Drawing Sheets

OTHER PUBLICATIONS

Fujishiro, F., et al., "Effects of resist strip processing damage on the electrical characteristics of 0.8–mocron a–Si antifuse circuit elements", *Abstract, Proceedings of the SPIE—The International Society for Optical Engineering, 2334*, Austin, TX, Abstract No. B9504–1265–011, (Oct. 20–21, 1994).

Gordon, K.E., et al., "Conducting filament of the programmed metal electrode amorphous silicon antifuse", *Abstract, Proceedings of the IEEE International Electron Devices Meeting, Technical Digest*, Washington, D.C., Abstract No. B9412–1265D–014, (Dec. 5–8, 1993).

Hamdy, E., et al., "Dielectric based antifuse for logic and memory ICs", *IEDM*, San Francisco, Ca, pp . 786–789, (1988).

Hodges, D.A., et al., "MOS Decoders", *In: Analysis and Design of Digital Integrated Circuits, 2nd Edition*, Section 9.1.3, 354–357, (1988).

Shih, C., et al., "Characterization and modeling of a highly reliable metal–to–metal antifuse for high–performance and high–density field–programmable gate arrays", *Abstract, Proceedings of the 35th Annual IEEE International Reliability Physics Symposium*, Denver, CO, Abstract No. B9709–2570D–023, (Apr. 8–10, 1997).

Zhang, G., et al., "Reliable metal–to–metal oxide antifuses", *Abstract, Proceedings of the IEEE International Electron Devices Meeting, Technical Digest*, San Francisco, CA, Abstract No. B9504–2530G–001, (Dec. 11–14, 1994).

* cited by examiner

ANTIFUSE STRUCTURES, METHODS, AND APPLICATIONS

RELATED APPLICATION

This is a continuation of U.S. patent application Ser. No. 09/258,363, filed Feb. 26, 1999 now U.S. Pat. No. 6,288,437, which application is incorporated herein by reference.

TECHNICAL FIELD

The present invention concerns integrated-circuit wiring, particularly programmable electrical connections, such as fuses and antifuses, and methods of making them.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then wired, or interconnected, together to define a specific electric circuit, such as a computer memory.

Because of the difficulties of making and interconnecting millions of microscopic components, fabricators expect that one or more parts of an integrated circuit will fail to operate correctly. However, rather than discard the entire integrated circuit because of a few defective parts, fabricators sometimes include extra, or redundant, parts in integrated circuits to selectively replace defective parts. For example, memory fabricators sometimes include redundant memory cells to replace defective memory cells in an integrated memory circuit. Fabricators can then test the memory circuit for defective cells and activate one or more of the redundant cells to save the integrated circuit.

Activating a redundant part often entails opening or closing, that is, programming, one or more programmable electrical connections between the redundant part and the rest of the integrated circuit. In general, there are two types of programmable electrical connections: fuses and antifuses. A fuse is a normally closed electrical connection which can be opened typically using a laser to melt and vaporize a portion of the fuse. An antifuse, on the other hand, is normally open and requires some action to close the connection, that is, to electrically connect one end of the antifuse to the other.

Antifuses typically include a thin, insulative layer sandwiched between two conductors. Closing, or programming, an antifuse generally requires applying a large voltage across the two conductors. The large voltage creates an electric field which exceeds the breakdown strength of the insulative layer, thereby rupturing the insulative layer and electrically connecting the two conductors.

Unfortunately, antifuses based on the breakdown or rupturing of an insulative layer perform poorly. Specifically, the resulting electrical connections often have high electrical resistances which ultimately waste power and slow down the transfer of electrical signals through integrated circuits. Moreover, these high resistances tend to vary significantly over time and thus make it difficult for integrated circuits to perform consistently as they age. Additionally, the rupturing process inevitably varies significantly from antifuse to antifuse within the same integrated circuit, introducing undesirable differences in the electrical traits of various parts of the circuit and thus compromising circuit performance. These and other performance concerns have ultimately led some fabricators to avoid using antifuses.

Accordingly, there is a need for better antifuses and antifuse programming techniques.

SUMMARY OF THE INVENTION

To address these and other needs, the inventors devised an integrated antifuse structure that includes two conductive elements and a programming mechanism for selectively moving one of the elements relative to the other, to, for example, bring them into electrical contact with each other. More specifically, one embodiment forms a chamber in an integrated circuit, with two conductive elements overhanging the top of the chamber and a third conductive element lying on the bottom of the chamber. The bottom of the chamber includes a chemical compound that when heated sufficiently rapidly evolves, or releases, a gas, such as hydrogen, nitrogen, or oxygen. The rapid release of gas into the chamber creates a force that moves the third element, like a piston, from the bottom of the chamber to contact the two elements overhanging the top of the chamber, thereby completing an electrical connection. The exemplary embodiment uses copper elements and ultimately promises better performance than conventional rupture-based antifuses because the copper elements have reproducible electrical resistances that remain stable during antifuse programming and subsequent aging.

Other facets of the invention include methods of making and operating antifuses and several integrated-circuit applications for antifuses in accord with the invention. For example, one integrated-circuit application is a programmable logic array, and another is an integrated memory circuit having redundant memory cells. The invention, however, can be applied to any integrated circuit where a programmable electrical connection, such as a fuse or antifuse, is desirable.

DETAILED DESCRIPTION OF PREFERRED EMBODIMENTS

Figure 1:
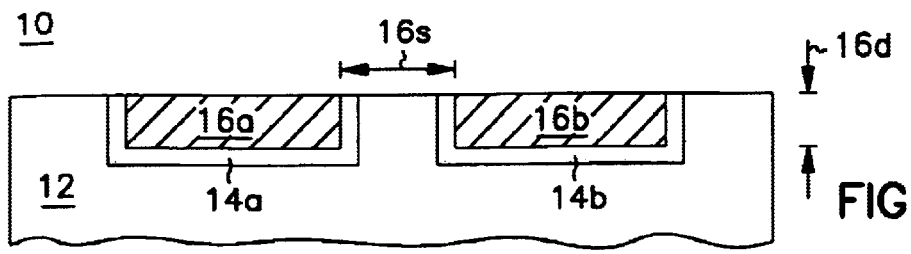
FIG. 1 is a cross-sectional view of an integrated-circuit assembly 10 at an early fabrication stage, including substrate 12, adhesion layers 14a and 14b, and conductors 16a and 16b.

The following detailed description, which references and incorporates FIGS. 1–8, describes and illustrates one or more specific embodiments (or implementations) of the invention. These embodiments, offered not to limit but only to exemplify and teach the invention, are shown and described in sufficient detail to enable those skilled in the art to implement or practice the invention. Thus, where appropriate to avoid obscuring the invention, the description may omit certain information known to those of skill in the art.

FIGS. 1–5 show a number of exemplary integrated-circuit assemblies, which taken collectively and sequentially, illustrate an exemplary method of making and using an exemplary antifuse (or more broadly a programmable electrical connection) within the scope of the present invention. The method, as shown in the cross-sectional view of FIG. 1, begins with formation of an integrated-circuit assembly or structure 10, which can exist within any integrated circuit, for example, an integrated memory circuit. Assembly 10 includes a substrate 12. The term "substrate," as used herein, encompasses a semiconductor wafer as well as structures having one or more insulative, semi-insulative, conductive, or semiconductive layers and materials. Thus, for example, the term embraces silicon-on-insulator, silicon-on-sapphire, and other advanced structures.

Substrate 12 includes adhesion layers 14a and 14b and conductors 16a and 16b. Conductors 16a and 16b, which serve as respective x- and y-address lines for the completed antifuse, occupy trenches having a depth 16d and are separated by a distance 16s. Distance 16s defines the effective length and thus the electrical resistance of a resistive heating element formed in later stages of the method. For precise control of this distance, the exemplary method uses a suitably patterned photoresistive mask and a reactive ion etching process to form shallow wells with vertical sidewalls within substrate 12. Then after forming adhesion layers 14a and 14b in the shallow wells, the exemplary method overfills them with conductive metal, ultimately using a chemical-mechanical planarization to finish the structure. To ensure predictable resistances, cracks or fissures within conductors 16a and 16b should be avoided.

In the exemplary embodiment, adhesion layers 14a and 14b, which promote adhesion of metal to substrate 12, comprise chromium and have thicknesses in the range of 50 to 100 angstroms. Conductors 16a and 16b are approximately 100–1000 angstroms thick and comprise copper. (The thickness of conductors 16a and 16b should generally be small to reduce lateral heat transfer away from the resistive element during programming of the antifuse.)

In other embodiments, conductors 16a and 16b comprise metals, such as aluminum and its alloys, gold, or silver, and nonmetals, such as heavily doped polysilicon. Other embodiments form adhesion layers 14a and 14b from materials such as titanium, tungsten, tantalum, and alloys thereof. Dimensions other than those described here are also within the scope of the invention. Thus, the invention is not limited to any particular genus or species of conductive materials or to any genus or species of adhesion materials or to any particular dimensions or dimensional relationships.

Figure 2:
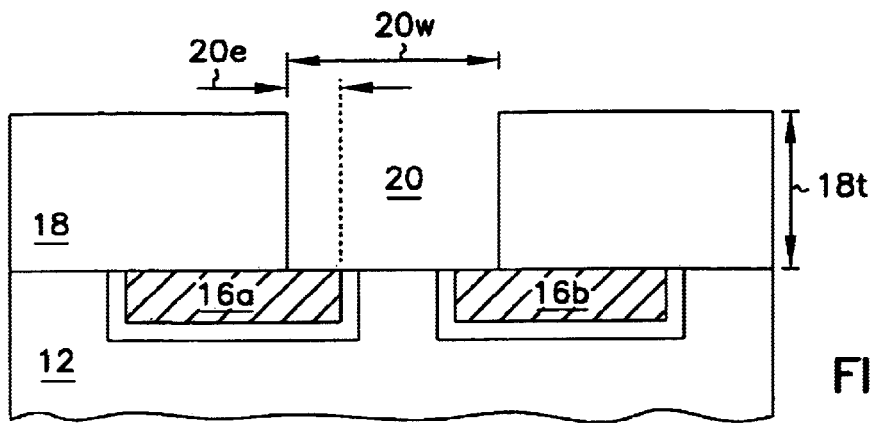
FIG. 2 is a cross-sectional view of the FIG. 1 integrated-circuit assembly after formation of an insulative layer 18 having an opening, or chamber, 20 which exposes portions of conductors 16a and 16b.

FIG. 2 shows that the exemplary method next entails forming an insulative layer 18 having an opening, or chamber, 20 exposing portions of substrate 12 and of conductors 16a and 16b. (Chamber 20 can also be viewed as an insulative well.) Insulative layer 18 has a thickness 18t of about 6000 angstroms in the exemplary embodiment and comprises any number of materials, for example, silicon dioxide, fluorinated silicon dioxide, silicon nitride, silicon oxynitride, aluminum oxide, or a polymer, such as fluorinated polyimide. Any number of techniques, for example, physical sputtering, low-pressure-chemical-vapor deposition (LPCVD) or plasma-enhanced-chemical-vapor deposition (PECVD), can be used to form layer 18.

Chamber 20, which has a square cross-section (when viewed from the top), has a width 20w of about 6000 angstroms. Chamber 20 exposes sections of conductors 16a and 16b, which have a width 20e of about 1000 angstroms, measured from a respective sidewall of chamber 20 and a respective conductor edge. In general, width 20e is selected to ensure overlap with a resistive element, namely layer 22, formed in subsequent stages of the method. Though not shown in the figure, the exemplary method applies and patterns a photoresistive layer to define the periphery of chamber 20, uses reactive-ion etching to form the chamber, and then removes the photoresistive layer in situ with an oxygen plasma. However, the invention is not limited to any particular method of forming chamber 20 or to any particular chamber dimensions or shapes. Indeed, other embodiments form chambers having smaller or larger cross-sectional areas and having round, elliptical, and other arbitrary regular or irregular shapes.

Figure 3:
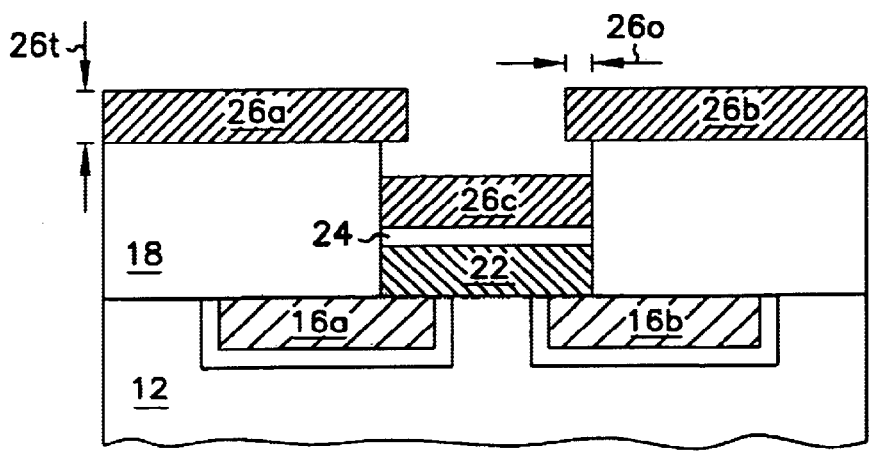
FIG. 3 is a cross-sectional view of the FIG. 2 integrated-circuit assembly, after formation of a metal layer 22, a metal-oxide layer 24, and a conductive layer 26 having parts 26a and 26b which overhang chamber 20 and part 26c which lies within chamber 20 on metal-oxide layer 24.

FIG. 3 shows that after forming insulative layer 18, the exemplary method sequentially forms a metal layer 22, a metal-oxide layer 24, and a conductive layer 26 having conductive elements 26a, 26b, and 26c. Elements 26a and 26b overhang opposing sides of chamber 20, and conductive element 26c lies within chamber 20 atop metal-oxide layer 24.

More particularly, to form metal layer 22, the exemplary method deposits and patterns a photoresist layer and etches layer 18 to expose portions of conductors 16a and 16b and the portion of substrate 12 between them. The method then cleans the exposed conductor and substrate surfaces using a sputtering treatment in an inert gas plasma. The inert gas plasma is sufficient to clean these surfaces, but does not significantly alter the patterned resist layer. After this cleaning, the exemplary method sputter deposits a 1000-angstrom-thick layer of metal on the floor of chamber 20.

The exemplary embodiment forms metal layer 22 from titanium; however, other embodiments use hafnium, niobium, tantalum, thorium, vanadium, zirconium, and any other metals and alloys having large capacities of holding hydrogen in solid solution and/or hydride and pseudo-hydride phases. For example, other metals that can hold several hundreds to many thousands of cubic centimeters of hydrogen per 100 grams of metal are likely to be suitable. More generally, the inventors believe that virtually any metal or compound that can hold a gas in the form of a solid solution, hydride, oxide, or nitride, for example, can be adapted to suit the function of the invention. Thus, the invention is not limited to the particular metals or gases disclosed here.

Forming metal-oxide layer 24, in the exemplary embodiment, entails oxidizing metal layer 24 in an oxygen ambient at 50–100° C. for about an hour to provide a thickness of 100–200 angstroms. (This procedure is generally suitable for most if not all metals with large hydrogen-holding capacities.) However, other embodiments directly deposit an insulative metallic oxide on layer 22 rather than using the exemplary oxidation procedure. Additionally, other embodiments use thicker or thinner metal-oxide layers to ensure electrical isolation of metal layer 22 from conductive element 26 during subsequent programming via conductors 16a and 16b. Layer 24 also serves to prevent or reduce adhesion of layer 22 and element 26. Adhesion can also be further reduced or mitigated by forming a very thin (about 10–50 angstroms) chemically inert carbon layer (not shown) between layer 22 and element 26c.

In the exemplary embodiment, forming conductive layer 26 entails sequentially sputtering an adhesion-promoting material, such as chromium, and a conductive material, such as copper, onto metal-oxide layer 24 and the shoulders of chamber 20. The exemplary methods deposits the adhesion-promoting material to a thickness of 50-to-100 angstroms and the conductive materials to a thickness of about 2000 angstroms. The total thickness of the adhesion-promoting and conductive materials is kept small to prevent the formation of conductive bridges between element 26c and elements 26a and 26b.

In general, conductive layer 26 comprises any material having a significantly lesser hydrogen solubility than that of metal layer 22, for example, several orders of magnitude less hydrogen solubility. Examples of metals that have relatively small hydrogen solubilities (that is, solubilities on the order of 0.1-to-5 cubic centimeters of hydrogen per 100 grams of metal) include copper, nickel, silver, molybdenum, aluminum, iron, tungsten, gold, platinum, ruthenium, rhodium, and their alloys. However, with appropriate sizing of chamber 20, layer 22, and element 26c, one may be able to form the antifuse using lesser differences in hydrogen solubilities.

To complete formation of the antifuse structure after depositing conductive layer 26, the exemplary method patterns it to define overhangs, using, for example, ion milling with a resist mask in place to protect element 26c within chamber 20. If the portions of conductive elements 26a and 26b overhanging chamber 20 are too short to stop movement of element 26c during programming of the antifuse, one can lengthen them in various ways including the following two. First, one can electro-deposit, or electroplate, additional metal onto these conductive elements. Plating 500 angstroms of additional metal, for example, yields overhangs of almost 500 angstroms. This entails using elements 26a and 26b as cathodes during plating and leaving element 26c, within the chamber, unbiased to prevent its plating. This bias arrangement focuses deposition on the top surfaces of elements 26a and 26b. Second, one can use a directional S-gun to deposit 500 angstroms of metal at a glancing angle on the top surface of layer 26. For example, one embodiment of the invention uses a glancing angle of 5 to 9 degrees relative the horizontal plane of the substrate. For this exemplary geometry, these small angles along with a modestly collimated beam of metal atoms from a deposition source will preclude formation of metal bridges between element 26c and elements 26a and 26b.

Figure 4:
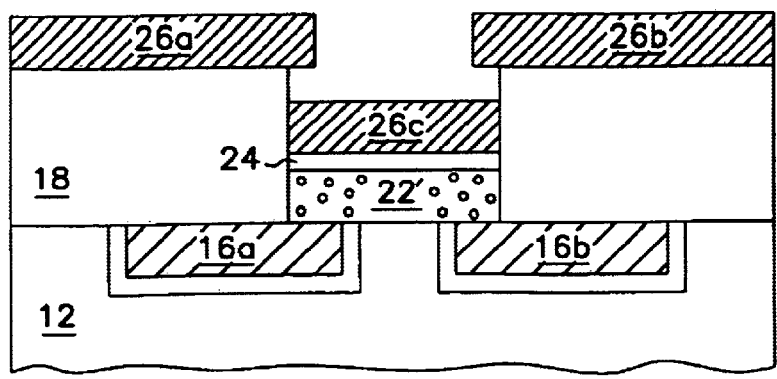
FIG. 4 is a cross-sectional view of the FIG. 3 assembly after charging metal layer 22 with hydrogen to form a metal-hydride layer 22'.

FIG. 4 shows that the exemplary method next partially or fully saturates metal layer 22 with hydrogen to form a metal-hydride layer 22'. (The effect of charging is denoted by the change from the parallel cross-hatching of layer 22 in FIG. 3 to the small circles in FIG. 4.) When titanium is used to form metal layer 22, the fully saturated layer 22' has the composition $TiH_2$. However, the exemplary embodiment does not require full conversion of metal layer 22 to a metal hydride, but only the storage of sufficient hydrogen to move element 26c into contact with elements 26a and 26b. (As used herein, metal hydride encompasses any compound including a metal and hydrogen, such as $TiH_2$ or a solid solution of hydrogen in titanium, that is, H—Ti.) Other embodiments can store lesser amounts of hydrogen to only move element 26c toward elements 26a and 26b should this be desirable to, for example, foster capacitive coupling of the elements.

To charge or saturate layer 22, the exemplary method heats the antifuse structure of FIG. 3 and introduces hydrogen under pressure. More specifically, it heats the antifuse structure to a temperature of 400–500° C. and introduces hydrogen under pressures of 0.1 to 1.0 atmospheres. Under these condition and without the presence of conductive element 26c, metal layer 22 completely converts to metal hydride with a few tens of seconds to a couple of minutes, depending on the specific hydriding temperature. (This would entail charging the layer before formation of conductive layer 26.) However, with the presence of conductive element 26c, extra time or hydrogen pressure are necessary to charge layer 22, because of the diffusion rate of hydrogen through element 26c to layer 22.

Experimental values of diffusivity of hydrogen through copper, particularly relevant to the exemplary chromium-copper form of conductive element 26c, are somewhat scattered. The range of diffusivity values suggest that a hydrogen pressure of one atmosphere is sufficient to diffuse hydrogen through a 10,000-angstrom-thick copper plate at 400° C. in quantities sufficient to form $TiH_2$ at rates ranging from 20 to 340 angstroms per minute. These estimates assume that metal layer 22 consists of titanium and that the hydriding process is 100 percent efficient. (Hydrogen absorption by metal layer 22 is extremely fast, compared to hydrogen diffusion through copper.)

Further assuming a titanium hydride formation of 20 angstroms per minutes, for example, suggests that charging for about 50 minutes under these temperature and pressure conditions would completely convert a 1000-angstrom-thick titanium layer 22 into $TiH_2$. Moreover, increasing the hydrogen pressure (and thus the hydrogen transport) by a factor of ten would reduce the charge time by a factor of ten, that is, from about 50 minutes to about 5 minutes. Alternatively, one could maintain the hydrogen pressure at 1.0 atmosphere and raise the temperature from 400 to 500° C. to reduce the charging time five-fold, that is, from about 50 minutes to about 10 minutes. These examples show that very acceptable combinations of charging temperature and pressure can be employed to transport hydrogen through conductive element 26c to convert metal layer 22 to metal-hydride layer 22' in an hour or less.

After saturating or charging layer 22 with hydrogen, the exemplary method cools the antifuse structure a few hundred degrees while still under the charging pressure to prevent undesirable evolution of hydrogen from the layer. At temperatures of about 150° C. and below, the metal hydride is stable.

Figure 5:
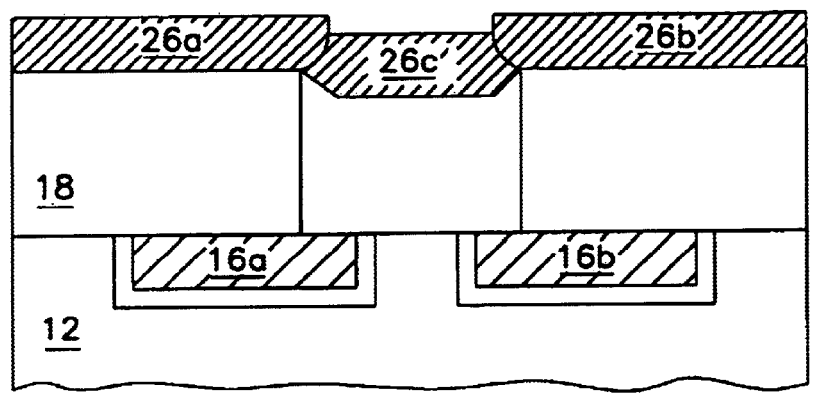
FIG. 5 is a cross-sectional view of the FIG. 4 assembly after applying an electrical voltage to conductors 16a and 16b that causes metal-hydride layer 22' to release hydrogen gas into chamber 20, which in turn moves conductive element 26c into contact with conductive elements 26a and 26b.

FIG. 5 shows the results of programming the antifuse of FIG. 4. Programming entails applying a voltage differential in the form of pulse across conductors 16a and 16b. In turn, this causes metal-hydride layer 22' to release or evolve hydrogen gas into chamber 20, through a process of chemical decomposition. (In embodiments that omit conductors 16a and 16b, one can apply heat to metal-hydride layer 22' using a laser, for example.) The release of gas into chamber 20, if achieved rapidly enough, moves conductive element 26c, like a piston, upward through chamber 20 into contact with conductive elements 26a and 26b. If the rate of movement is sufficient, the impact of conductive element 26c with the overhanging portions of elements 26a and 26b fuses element 26c to elements 26a and 26b, thereby forming an electrical connection.

For illustration, the inventors estimate that a 4000-angstrom-by-4000-angstrom-by-1000-angstrom (length×width×height) fully saturated titanium-hydride layer 22 can release $3.0 \times 10^{-7}$ cubic-centimeters of hydrogen (as measured at one atmosphere and 0° C.) Within the volume of chamber 20, this translates into a pressure exceeding 30,000 atmospheres. Such pressure can accelerate element 26c to a rate sufficient to fuse the element with elements 26a and 26b on impact. The impact will likely cause some deformation of all three conductive elements and thus allow much, if not all, of the released hydrogen to escape chamber 20.

In the exemplary embodiment, one controls the programming process through use of varying programmable voltage pulses which controllably raise the temperature of the metal-hydride layer to the desired hydrogen evolution temperatures in a time on the order of several microseconds. In the case of $TiH_2$, hydrogen evolution rates are exceedingly rapid for temperatures over 400° C., and the hydrogen evolution rates increase rapidly with increasing temperatures above 500–600° C. Assuming that titanium metal and titanium hydride have approximately the same electrical resistivity, namely about 80 micro-ohm-centimeters, suggests voltage pulses of 1.25 to 5.0 volts in magnitude and a few microseconds in duration heat a TiH2 resistive film to temperatures in the 400–800° C. range and thereby release a large fraction of its hydrogen content.

One can also apply lower voltages to "disarm" charged and unprogrammed antifuses selectively through a slower release of gas from metal-hydride layer 22. Similarly, one can also heat an entire integrated circuit slowly over time to slowly decompose the metal-hydride layer. In these cases, the hydrogen gas seeps out of chamber 20 without moving element 26c at all or without moving it far enough to form an electrical connection between elements 26a and 26b.

Other possibilities for controlling hydrogen evolution temperatures from metal-hydride layer 22 stem from understanding that metal hydrides have a wide range of absorption-desorption properties. For example, vanadium hydride ($VH_x$ where x is about one) contains only half as much hydrogen as $TiH_2$ but evolves almost all its hydrogen at temperature of 200 to 300° C. Additionally, one can form alloy compositions of high-hydrogen-solubility metals to obtain metal hydride layers with tailored hydrogen absorption-desorption characteristics. For example, a V—Ti alloy film charged with hydrogen evolves its hydrogen at a temperature intermittent between that characteristic of $VH_x$ and $TiH_2$.

Materials for Other Embodiments of the Antifuse Structure

As noted earlier, metal layer 22 can be formed from a wide range of metals that can hold or store hydrogen in sufficient evolvable quantities to serve the purpose of the invention. Additionally, there are a number of other compounds, including oxides, carbonates, and nitrides, that have capacity for storing or holding nitrogen or oxygen in generous amounts. Examples of these compounds include: $Pb_3O_4$ (550), $PbO_2$ (315), HgO (430), $Ag_2O$ (185), $MnO_2$ (480), $Ag_2O$ (185), $K_3N$ (355), $Rb_3N$ (415), $ReN_{0.43}$ (280), $Co_3N$ (380), $Ni_3N$ (420), and $Cd_3N_2$ (320). The parenthetical temperatures are the temperatures (in degrees Celsius) at which each compound dissociates and evolves oxygen or nitrogen gas. For example, $Pb_3O_4$ evolves oxygen gas at 550° C., and $K_3N$ evolves nitrogen at 355° C. However, unlike metal hydrides, these compounds generally do not function well as thin-film resistors and require a separate heating source or element to trigger evolution of oxygen or nitrogen.

Figure 6:
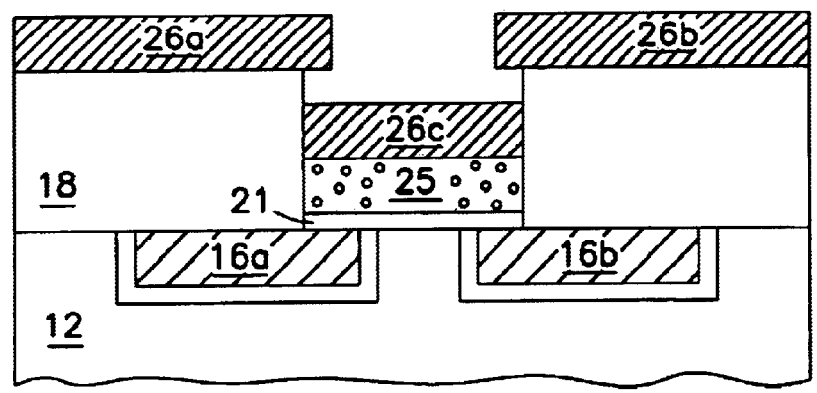
FIG. 6 is a cross-sectional view of alternative antifuse structure 10' which includes a separate thin-film resistor 21 connected to conductors 16a and 16b and a gas-releasing layer 25.

Accordingly, FIG. 6 shows an exemplary embodiment of an antifuse structure 10' which applies one or more of these compounds in a manner analogous to the metal hydrides in FIGS. 3 and 4. In particular, antifuse structure 10' is identical to the structure in FIGS. 3 and 4, except for a separate thin-film resistive element 21 and a gas-releasing layer 25, which replace layers 22 and 24. (For electrical isolation, one can also include an insulative layer between layers 21 and 25.) As explained above, one of ordinary skill can form layer 25 from a wide range of oxides, carbonates, and nitrides, indeed virtually any compound that releases a gas. Moreover, if desirable, one could form layer 25 from a "gas chargeable" precursor compound and then charge it, as, for example, metal layer 22 was charged with hydrogen, to form a gas-releasing compound.

Examples of materials suitable for resistive element 22 include tantalum-aluminum alloy (Ta—Al), nichromium (Ni—Cr), and hafnium diboride ($HfB_2$). These and other materials generate high temperatures in short time periods under appropriate electrical stimulus. Thus, as in antifuse structure 10, programming antifuse structure 10' entails applying a suitable voltage pulse to conductors 16a and 16b, which in turn causes resistive element 21 to generate sufficient heat to evolve gas from gas-releasing layer 25 and to thereby move conductive element 26c into contact with conductive elements 26a and 26b (as shown in FIG. 5.)

Exemplary Integrated-Circuit Applications of the Antifuse Structure

The antifuse of the present invention, particularly the exemplary antifuse structures of FIG. 3 (disarmed or uncharged), FIGS. 4 and 6(unprogrammed), and FIG. 5 (programmed) are suitable for virtually any integrated circuit where a fuse or antifuse is desirable. Two exemplary integrated circuit applications are shown in FIGS. 7 and 8.

Figure 7:
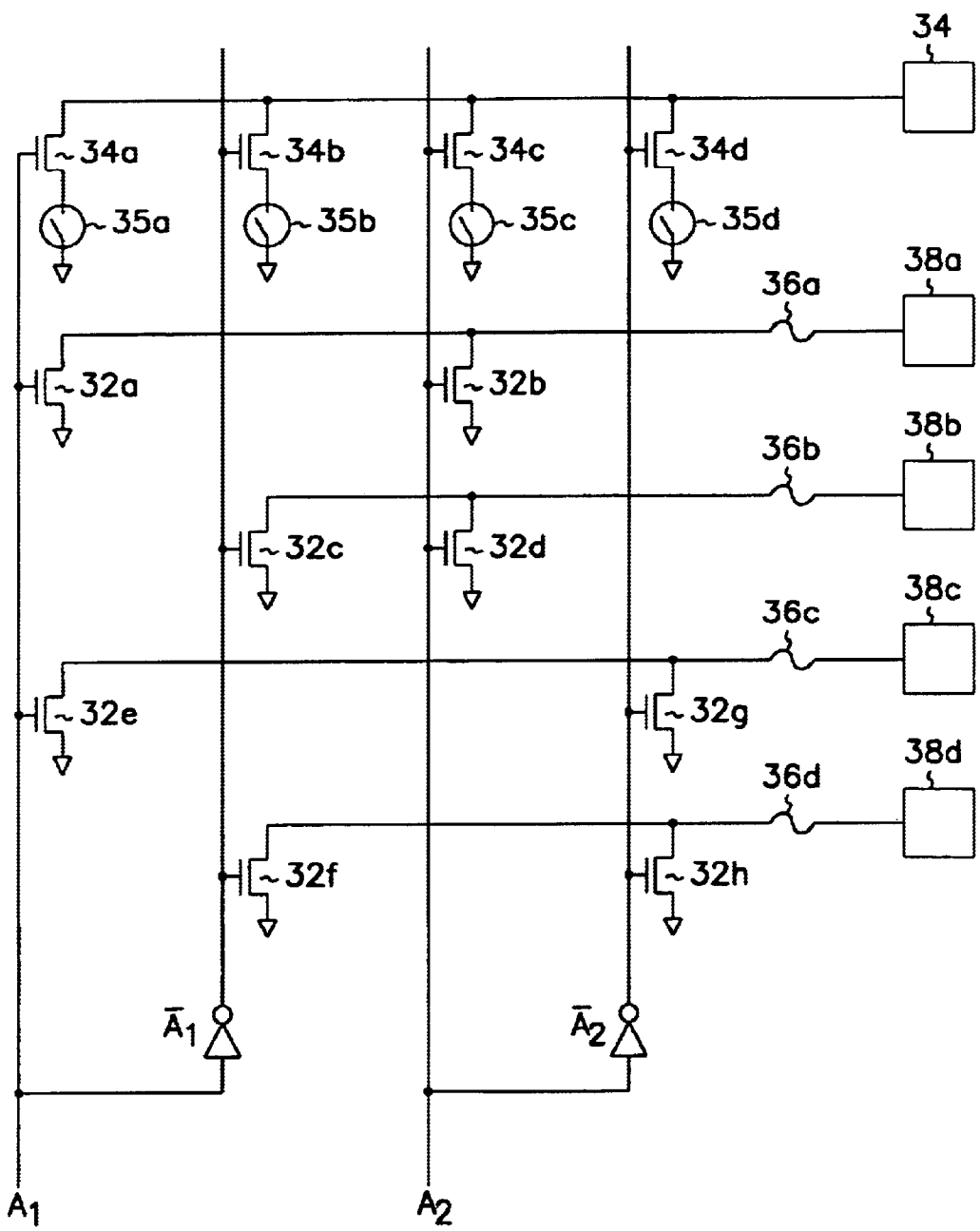
FIG. 7 is a partial schematic diagram of an integrated memory circuit 30 incorporating at least one redundant memory cell and an antifuse resembling the integrated-circuit assembly of FIG. 4 or FIG. 5.

FIG. 7 is a partial schematic diagram of a generic integrated memory address circuit 30 incorporating several antifuses 35a–35d in accord with the present invention. In many embodiments, the integrated circuit is part of a larger system, such as computer system or more generally a computerized system including a microprocessor or digital signal processor coupled to the memory circuit. In addition to the antifuses, memory circuit 30 includes a set of address transistors 32a–32h, a set of redundant address transistors 34a–34d, and conventional laser fuses 36a–36d. Address transistors 32a–32h are conventionally used to address rows 38a–38d in the memory array. Each row includes one or more memory cells. (For clarity, the figure omits many conventional features of integrated memory circuits.) One or more of antifuses 35a–35d and one or more of laser fuses 36a–36d can be selectively programmed to replace one or more of memory rows 38a–38d with redundant memory row 34. In some embodiments, one or more of the antifuses are programmed and one or more others remain unprogrammed, and in some embodiments all the antifuses are either programmed or unprogrammed.

Figure 8:
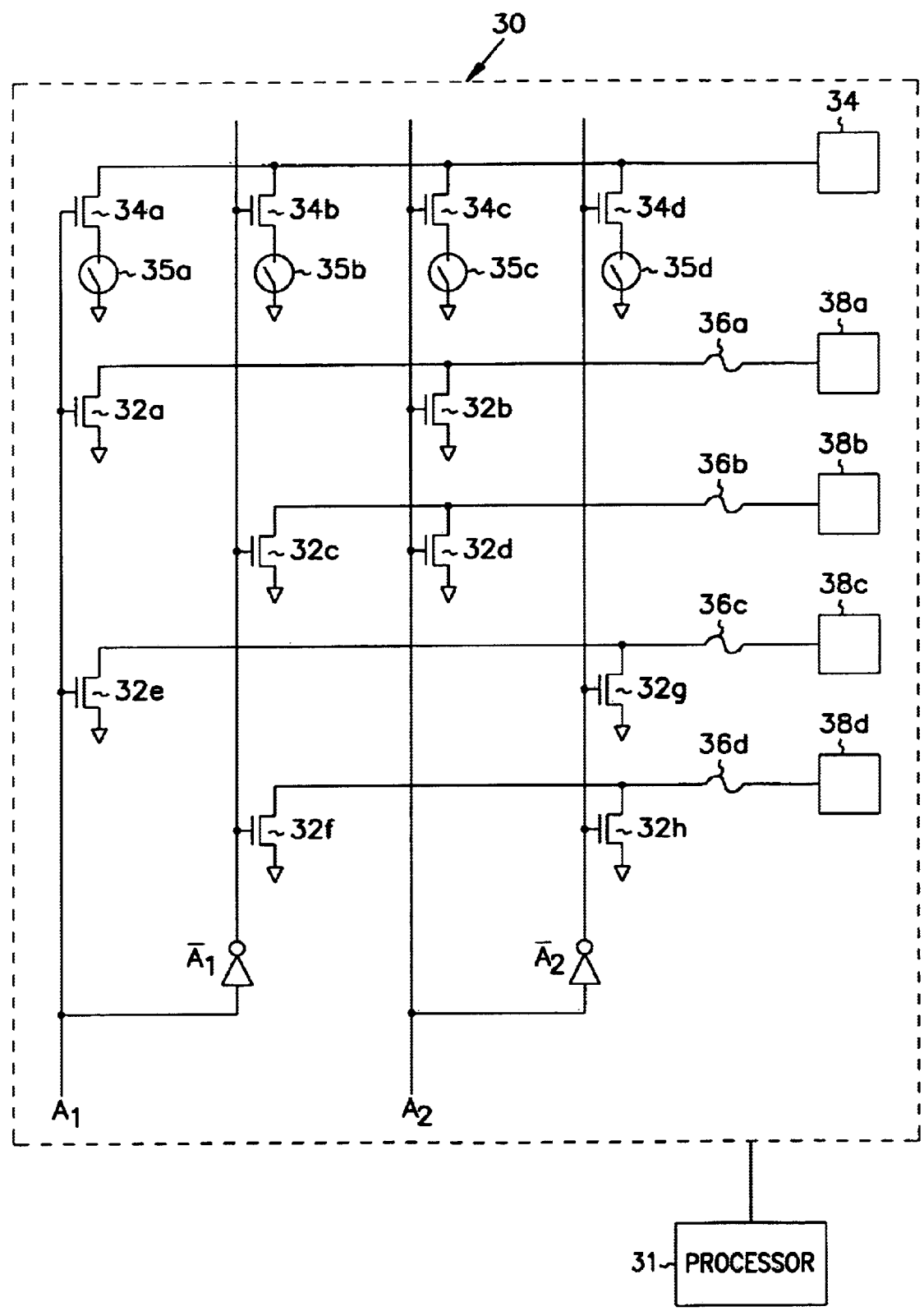
FIG. 8 is a partial schematic diagram of a programmable logic array 40 incorporating several antifuses resembling the integrated-circuit assemblies shown in FIGS. 3, 4, 5, or 6.
Figure 9:
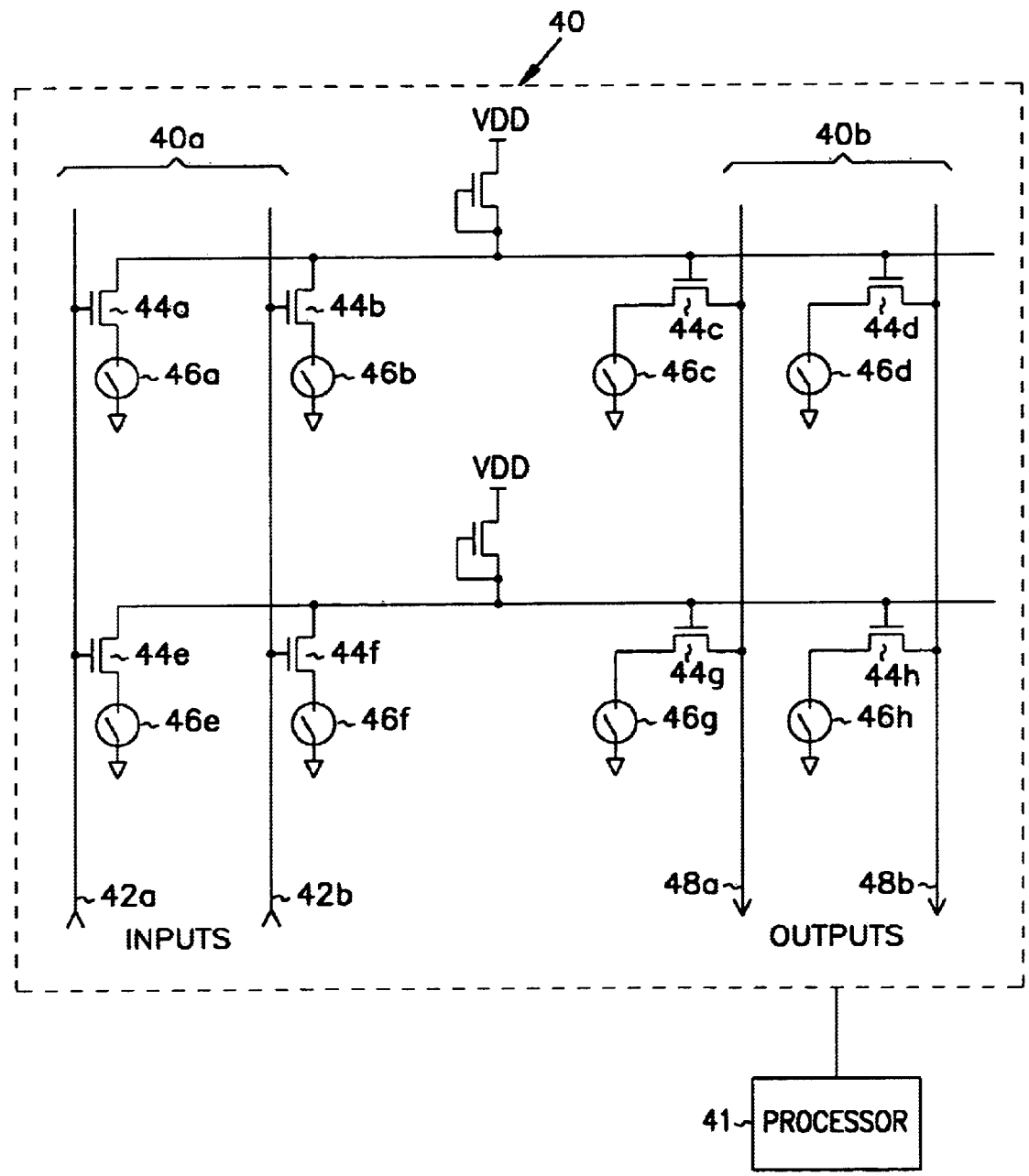

FIG. 8 shows a partial schematic diagram of a programmable logic array 40 incorporating several antifuses 46a–46g in accord with the integrated-circuit assemblies shown in FIGS. 3, 4, 5, or 6. More specifically, logic array 40, patterned after a NOR-NOR field-programmable array (FPLA), includes NOR sub-arrays 40a and 40b, representative inputs 42a and 42b, field-effect transistors 44a–44h, antifuses 46a–46g, and representative outputs 48a and 48b. With the exception for the novel antifuses and related programming techniques, array 40 operates in accord with conventional programmable logic arrays. Although shown with field-effect transistors, the array can be implemented using other transistor technologies, such as bipolar junctions transistors or mixed transistors technologies, such as bipolars and field-effect transistors. In some embodiments, logic array 40 is coupled to a microprocessor or digital signal processor in a larger system.

Conclusion

In furtherance of the art, the inventor has devised an antifuse structure, a method of making the antifuse structure, and related methods of programming, using, and arming and disarming antifuses. The exemplary embodiment of the antifuse structure includes three normally disconnected (or connected) conductive elements and a programming mechanism for selectively moving one of the elements to electrically connect (or disconnect) the other two, or more broadly, moving one element relative another element.

The exemplary programming mechanism includes a chemical composition that when exposed to sufficient heat rapidly releases a gas that moves a conductive element, like a piston, into contact with two other elements This embodiment ultimately promises better performance than conventional rupture-based antifuses because the conductive element that completes the electrical connection has a resistance that is relatively unaffected by the programming process and that remains relatively constant as it ages.

The embodiments described above are intended only to illustrate and teach one or more ways of practicing or implementing the present invention, not to restrict its breadth or scope. The actual scope of the invention, which encompasses all ways of practicing or implementing the concepts of the invention, is defined only by the following claims and their equivalents.

What is claimed is:

1. An antifuse structure in an integrated circuit, comprising:
    first, second and third conductive members; and
    means for moving at least a portion of the second conductive member as a solid unit relative the first and third conductive members, wherein the means for moving the second conductive member comprises a material composition including a gas in solid solution.

2. The antifuse structure of claim 1, wherein the means for moving the second conductive member comprises a material composition including hydrogen in solid solution or in a hydride phase.

3. The antifuse structure of claim 1, wherein the means for moving the second conductive member comprises at least one of titanium, hafnium, niobium, tantalum, thorium, vanadium, and zirconium, and hydrogen in solid solution or in a hydride phase.

4. The antifuse structure of claim 1, wherein the means for moving the second conductive member comprises a thin-film resistor and a layer comprising at least one of the following compounds: $Pb_3O_4$, $PbO_2$, HgO, $Ag_2O$, $MnO_2$, $Ag_2O$, $K_3N$, $Rb_3N$, $ReN_{0.43}$, $Co_3N$, $Ni_3N$, or $Cd_3N_2$.

5. An antifuse structure in an integrated circuit, comprising:
    first and second noncontacting conductive members; and
    a layer comprising hydrogen in solid solution or a hydride phase adjacent to one of the first and second noncontacting conductive members, wherein the layer comprises an amount of hydrogen sufficient upon release to move the one of the first and second noncontacting conductive members.

6. The antifuse structure of claim 5, wherein the layer comprises titanium hydride.

7. The antifuse structure of claim 5, wherein the layer comprises at lease one of titanium, hafnium, niobium, tantalum, thorium, vanadium, and zirconium, and hydrogen in solid solution or in a hydride phase.

8. The antifuse structure of claim 5, wherein the first noncontacting conductive member lies at least partly between the layer comprising the gas in solid solution or hydride phase and the second noncontacting conductive member.

9. An antifuse structure in an integrated circuit, comprising:
    first and second noncontacting conductive members; and
    a layer comprising a gas in solid solution or hydride phase for moving the second conductive member relative the first conductive member.

10. The antifuse structure of claim 9, wherein the layer comprises a material composition including hydrogen in solid solution or in a hydride phase.

11. The antifuse structure of claim 9, wherein the layer comprises at least one of titanium, hafnium, niobium, tantalum, thorium, vanadium, and zirconium, and hydrogen in solid solution or in a hydride phase.

12. The antifuse structure of claim 9, wherein the first noncontacting conductive member lies at least partly between the layer comprising the gas in solid solution or hydride phase and the second noncontacting conductive member.

13. An antifuse structure in an integrated circuit, comprising:
    first, second, and third noncontacting conductive members; and
    a layer adjacent the second conductive member and comprising at least one of titanium, hafnium, niobium, tantalum, thorium, vanadium, and zirconium, and hydrogen in solid solution or in a hydride phase.

14. An antifuse structure in an integrated circuit, comprising;
    first, second, and third noncontacting conductive members; and
    a layer adjacent to the second conductive member and comprising at least one of a metal hydride, $Pb_3O_4$, $PbO_2$, HgO, $Ag_2O$, $MnO_2$, $Ag_2O$, $K_3N$, $Rb_3N$, $ReN_{0.43}$, $Co_3N$, $Ni_3N$, or $Cd_3N_2$ or a compound which can be charged with hydrogen, oxygen or nitrogen to yield one of these compounds.

15. An antifuse structure in an integrated circuit, comprising:
    first, second, and third noncontacting conductive members; and
    a layer adjacent to the second noncontacting conductive members for moving the second conductive member into contact with the first conductive member, the layer comprising at least one of titanium, hafnium, niobium, tantalum, thorium, vanadium, and zirconium, and hydrogen in solid solution or in a hydride phase.

16. An antifuse structure in an integrated circuit, comprising:
   a chamber having a bottom and a top and two or more opposing interior-wall portions extending between the top and bottom;
   a high-gas-saturatable layer at least partially within the chamber; and
   a conductive, low-gas-saturatable layer between the high-gas-saturatable layer and the top of the chamber and contacting at least two of the opposing interior-wall portions.

17. The antifuse structure of claim 16 wherein the high-gas-saturatable layer has a hydrogen-gas-solubility at least 10 times greater than that of the conductive, low-gas-saturatable layer.

18. The antifuse structure of claim 16, wherein the chamber comprises:
   a semiconductive substrate; and
   an insulative layer on the substrate and having an opening exposing a portion of the substrate, with the exposed portion of the substrate defining at least a portion of the bottom of the chamber and the opening defining the interior sidewalls of the chamber.

19. An antifuse structure in an integrated circuit, comprising:
   an insulative chamber having a bottom and a top and one or more interior walls extending between the top and bottom;
   a high-gas-saturatable layer at least partially within the chamber;
   a conductive, low-gas-saturatable layer between the high-gas-saturatable layer and the top of the chamber; and
   first and second conductive members overhanging the top of the chamber.

20. The antifuse structure of claim 19 wherein the high-gas-saturatable layer has a hydrogen-gas-solubility at least five times greater than that of the conductive, low-gas-saturatable layer.

21. The antifuse structure of claim 19, wherein the high-gas-saturatable layer comprises at least one of titanium, hafnium, niobium, tantalum, thorium, vanadium, and zirconium.

22. The antifuse structure of claim 19 wherein the chamber comprises:
   a substrate; and
   an insulative layer on the substrate and having an opening exposing a portion of the substrate, with the exposed portion of the substrate defining at least a portion of the bottom of the chamber and the opening defining the interior sidewalls of the chamber.

23. An antifuse structure in an integrated circuit, comprising:
   a chamber having a bottom and a top and one or more interior walls extending between the top and bottom;
   a conductive layer within the chamber;
   a layer within the chamber between the conductive layer and the bottom of the chamber; and comprising a material having a hydrogen-gas-solubility at least 10 times greater than that of at least a portion of the conductive layer; and
   first and second conductive members overhanging the top of the chamber.

24. The antifuse structure of claim 23 wherein the chamber comprises:
   a substrate; and
   an insulative layer on the substrate and having an opening exposing a portion of the substrate, with the exposed portion of the substrate defining at least a portion of the bottom of the chamber and the opening defining the interior sidewalls of the chamber.

25. The antifuse structure of claim 23 wherein the first and second conductive members overhang the chamber by at least 250 angstroms.

26. The antifuse structure of claim 23, wherein the layer comprises at least one of titanium, hafnium, niobium, tantalum, thorium, vanadium, and zirconium, and hydrogen in solid solution or hydride phases.

27. The antifuse structure of claim 23 wherein the layer within the chamber comprises $Pb_3O_4$, $PbO_2$, $HgO$, $Ag_2O$, $MnO_2$, $Ag_2O$, $K_3N$, $Rb_3N$, $ReN_{0.43}$, $Co_3N$, $Ni_3N$, or $Cd_3N_2$.

28. The antifuse structure of claim 23, wherein the conductive layer comprises at least one of aluminum, copper, silver, and gold.

29. An antifuse structure in an integrated circuit, comprising:
   an insulative chamber having a bottom and a top and one or more interior walls extending between the top and bottom;
   a conductive layer within the chamber and comprising at least one of aluminum, copper, silver, and gold;
   a layer lying within the chamber between the conductive layer and the bottom of the chamber, and comprising at least one of titanium, hafnium, niobium, tantalum, thorium, vanadium, and zirconium, and hydrogen in solid solution or in one or more hydride phases or at least one of $Pb_3O_4$, $PbO_2$, $HgO$, $Ag_2O$, $MnO_2$, $Ag_2O$, $K_3N$, $Rb_3N$, $ReN_{0.43}$, $Co_3N$, $Ni_3N$, or $Cd_3N_2$; and
   first and second conductive members each overhanging the top of the chamber by at least 250 angstroms.

30. The antifuse structure of claim 29 wherein the chamber comprises:
   a semiconductive substrate; and
   an insulative layer on the substrate and having an opening exposing a portion of the substrate, with the exposed portion of the substrate defining at least a portion of the bottom of the chamber and the opening defining the interior sidewalls of the chamber.

31. An antifuse structure in an integrated circuit, comprising:
   an insulative chamber having a bottom and a top and two or more opposing interior-wall portions extending between the top and bottom;
   a conductive layer within the chamber, contacting at least two of the opposing interior-wall portions, and comprising at least one of aluminum, copper, silver, and gold; and
   first and second conductive members each overhanging the top of the chamber by at least 250 angstroms and each electrically decoupled from the conductive layer.

32. The antifuse structure of claim 31 wherein the chamber comprises:
   a substrate; and
   an insulative layer on the substrate and having an opening exposing a portion of the substrate, with the exposed portion of the substrate defining at least a portion of the bottom of the chamber and the opening defining the interior sidewalls of the chamber.

33. An antifuse structure in an integrated circuit, comprising:
a chamber having a bottom and a top and one or more interior walls extending between the top and bottom;
a conductive layer within the chamber and comprising at least one of aluminum, copper, silver, and gold; and
first and second conductive members each overhanging the top of the chamber by at least 250 angstroms and contacting the conductive layer within the chamber at respective first and second lap joints.

34. The antifuse structure of claim 33 wherein the first and second conductive members are fused to the conductive layer at each of the first and second lap joints.

35. A structure for a programmable electrical connection in an integrated circuit, comprising:
a chamber having a bottom, a top, and two or more opposing interior-wall portions extending between the top and bottom;
a conductive layer within the chamber and contacting at least two of the opposing interior-wall portions; and
one or more conductive members, each overhanging the top of the chamber.

36. A programmable electrical connection comprising:
a layer having a cavity;
first and second conductive members having respective first and second ends overhanging the cavity;
a third conductive member in the cavity spaced from the first and second ends; and
means for displacing the third conductive member toward the first and second ends and electrically connecting the first and second conductive members.

37. The programmable electrical connection of claim 36 wherein the means for displacing the third conductive member toward the first and second ends includes a layer comprising a gas in solid solution or in a hydride phase or a layer comprising at least one of the following compounds: $Pb_3O_4$, $PbO_2$, $HgO$, $Ag_2O$, $MnO_2$, $Ag_2O$, $K_3N$, $Rb_3N$, $ReN_{0.43}$, $Co_3N$, $Ni_3N$, or $Cd_3N_2$.

38. A structure for a programmable electrical connection in an integrated circuit, comprising:
first and second conductive members; and
means for moving the second conductive member as a solid unit relative the first conductive member.

39. An integrated circuit comprising:
one or more transistors; and
one or more programmable electrical connections integral to the circuit and coupled to each of the one or more transistors, with each programmable electrical connection comprising:
at least a first and a second conductive member; and
means for moving the second conductive member as a solid unit relative the first conductive member.

40. The integrated circuit of claim 39, wherein the means for moving the second conductive member relative the first conductive member moves the second conductive member toward the first conductive member.

41. An integrated circuit comprising:
one or more transistors; and
one or more programmable electrical connections, with each coupled to at least one of the one or more transistors and comprising:
at least a first and a second conductive member; and
means for moving at least a portion of the second conductive member as a solid unit relative the first conductive member.

42. The integrated circuit of claim 41, wherein the means for moving the second conductive member as a solid unit relative the first conductive member moves the second conductive member toward the first conductive member.

43. A programmable logic array comprising:
one or more transistors; and
one or more programmable electrical connections coupled to each of the one or more transistors, with each programmable electrical connection comprising:
first and second conductive members; and
means for moving at least a portion of the second conductive member as a solid unit relative the first conductive member.

44. The integrated circuit of claim 43, wherein the means for moving the second conductive member relative the first conductive member moves the second conductive member toward the first conductive member.

45. An integrated memory circuit comprising:
one or more memory cells;
one or more redundant memory cells; and
one or more programmable electrical connections coupled to each of the one or more redundant memory cells, with each programmable electrical connection comprising:
first and second conductive members; and
means for moving the second conductive member as a solid unit relative the first conductive member.

46. A system comprising:
a processor; and
an integrated circuit, with the integrated circuit including one or more programmable electrical connections coupled to each of the one or more redundant memory cells, with each programmable electrical connection comprising:
first and second conductive members; and
means for moving at least a portion of the second conductive member as a solid unit relative the first conductive member.

47. A method of operating an antifuse in an integrated circuit, the method comprising:
saturating a portion of the antifuse with a gas; and
releasing gas from the saturated portion of the antifuse to program the antifuse.

48. A method of operating an antifuse in an integrated circuit, the method comprising:
saturating a first member of the antifuse with a gas; and
releasing gas from the first member; and
in response to releasing gas from the first member, moving a second member into contact with a third member.

49. The method of claim 48, wherein releasing gas from the first member comprises heating at least the first member.

50. A method of operating one or more antifuses in an integrated circuit, with each antifuse having a normally open electrical connection, the method comprising:
saturating a portion of one or more of the antifuses with a gas;
releasing gas from the saturated portions of one or more of the antifuses; and
in response to releasing gas from the saturated portions of the one or more of the antifuses, closing the normally open electrical connection of the one or more of the antifuses.

51. The method of claim 50, wherein saturating a portion of one or more of the antifuses with a gas comprises at least partially saturating a layer with hydrogen.

52. The method of claim 50, wherein releasing gas from the saturated portion of the one or more antifuses comprises heating the saturated portion.

53. A method of operating one or more programmable electrical connections in an integrated circuit, the method comprising:

- at least partially saturating a portion of one or more of the programmable electrical connections with a gas;
- releasing gas at a first rate from the saturated portions of one or more of the programmable electrical connections;
- in response to releasing gas at the first rate from the saturated portions of the one or more of the programmable electrical connections, changing electrical status of the one or more of the programmable electrical connections; and releasing gas at a second rate different from the first rate from the saturated portions of one or more of the antifuses.

54. A method of operating a programmable electrical connection in an integrated circuit, the method comprising:

- applying a voltage to a resistor;
- heating a hydride, oxide, nitride, or carbonate compound in response to applying the voltage to the resistor;
- releasing or evolving a gas from the hydride, oxide, nitride, or carbonate compound in response to heating; and
- moving a first conductive element relative a second conductive element in response to releasing or evolving the gas.

55. The structure of claim 35, wherein each conductive member is electrically decoupled from the conductive layer.

* * * * *

UNITED STATES PATENT AND TRADEMARK OFFICE
CERTIFICATE OF CORRECTION

PATENT NO. : 6,861,727 B2
DATED : March 1, 2005
INVENTOR(S) : Forbes et al.

It is certified that error appears in the above-identified patent and that said Letters Patent is hereby corrected as shown below:

Title page,
Item [56], References Cited, OTHER PUBLICATIONS, "Hodges, D.A., et al.," reference, after "Section" insert -- : --.

Column 7,
Line 32, delete "TiH2" and insert -- $TiH_2$ --, therefor.

Column 10,
Line 13, delete "lease" and insert -- least --, therefor.
Lines 48-49, after "comprising" delete ";" and insert -- : --, therefor.

Column 11,
Line 13, after "claim 16" insert -- , --.
Lines 38 and 47, "claim 19" insert -- , --.
Line 62, after "chamber" delete ";" and insert -- , --, therefor.

Column 12,
Lines 1, 9 and 17, after "claim 23" insert -- , --.
Line 39, after "claim 29" insert -- , --.
Line 60, after "claim 31" insert -- , --.

Column 13,
Line 11, after "claim 33" insert -- , --.
Line 33, after "claim 36" insert -- , --.

Signed and Sealed this

Seventh Day of June, 2005

JON W. DUDAS
*Director of the United States Patent and Trademark Office*